US008339147B2

(12) United States Patent
Kaltner

(10) Patent No.: US 8,339,147 B2
(45) Date of Patent: Dec. 25, 2012

(54) ARRANGEMENT FOR PRODUCING AN ELECTRIC FIELD AND SENSOR DEVICE INCLUDING SAME

(75) Inventor: Klaus Kaltner, Bergkirchern (DE)

(73) Assignee: Ident Technology AG, Wessling (DE)

(*) Notice: Subject to any disclaimer, the term of this patent is extended or adjusted under 35 U.S.C. 154(b) by 1003 days.

(21) Appl. No.: 12/282,894

(22) PCT Filed: Mar. 13, 2007

(86) PCT No.: PCT/EP2007/002215
§ 371 (c)(1),
(2), (4) Date: Jan. 28, 2009

(87) PCT Pub. No.: WO2007/104540
PCT Pub. Date: Sep. 20, 2007

(65) Prior Publication Data
US 2009/0321149 A1  Dec. 31, 2009

(30) Foreign Application Priority Data

Mar. 13, 2006 (DE) .......................... 10 2006 011 825

(51) Int. Cl.
*G01R 27/26* (2006.01)
(52) U.S. Cl. ........................................... 324/663
(58) Field of Classification Search ........... 324/658–690
See application file for complete search history.

(56) References Cited

U.S. PATENT DOCUMENTS

| 3,406,802 | A | * | 10/1968 | Needham et al. | 192/130 |
| 5,964,478 | A | * | 10/1999 | Stanley et al. | 280/735 |
| 6,445,294 | B1 | * | 9/2002 | McDonnell et al. | 340/562 |

* cited by examiner

*Primary Examiner* — Melissa Koval
*Assistant Examiner* — Daniel Miller
(74) *Attorney, Agent, or Firm* — King & Spalding L.L.P.

(57) ABSTRACT

A circuit arrangement has a field producing electrode device which is connected in an LC network and exposed to a spatial area of the field such that the capacity of the capacitor system with the electrode device alters according to dielectric properties of material present in the spatial area, an insulating layer extending on a rear side of the field electrode device which is oriented away from the spatial area, a screening electrode device which extends on the rear side of the insulating layer which is oriented away from the field electrode device and a field extinction electrode device which has an electrode surface which is oriented towards an extinction area. The field expansion electrode device and the field extinction electrode device are arranged such and impinged upon by a voltage that the spatial area of the field and the extinction area are superimposed on each other in sections.

20 Claims, 3 Drawing Sheets

ARRANGEMENT FOR PRODUCING AN ELECTRIC FIELD AND SENSOR DEVICE INCLUDING SAME

CROSS REFERENCE TO RELATED APPLICATIONS

This application is the US national phase of PCT application PCT/EP2007/002215, filed Mar. 13, 2007, published Sep. 20, 2007 as WO 2007/104540, and claiming the priority of German patent application 10 2006 011 825.1 itself filed Mar. 13, 2006, whose entire disclosures are herewith incorporated by reference.

BACKGROUND

The various embodiments are directed to an arrangement for the generation of an electric field which is significantly shaped with respect to its spatial propagation. Further embodiments are directed to a sensor device including the above mentioned arrangement.

SUMMARY

According to various embodiments, solutions which make it possible to create an alternating electric field with quasi-static properties which propagates into a supervision area with a certain focusing effect can be provided.

According to various embodiments this object is performed by a circuit arrangement comprising:
 a field gene rating electrode device which is included into an LC-network and which is exposed toward a field space in such a manner that the capacitance of a condenser system which includes said field gene rating electrode varies in response of the dielectric properties of material present within said field space,
 an insulator layer extending on a rear side of said field gene rating electrode device, and facing away from said field space,
 a shield electrode device extending on a rear side of said insulating layer and facing away from said field space, and
 a field extinction electrode device which comprises an electrode area facing toward an extinction area, wherein said the field gene rating electrode device and the field extinction electrode device are arranged in such a manner and subjected to electric tension that the field space and the extinction field space partially overlap each other.

BRIEF DESCRIPTION OF THE DRAWINGS

Further details and features of the various embodiments will become evident from the subsequent description in connection with the drawing. Wherein.

DETAILED DESCRIPTION

On the basis of the above mentioned approach its made possible in an advantageous manner to cut off the lateral indifferent margin regions of the field generated by the field generating electrode and to sharply limit the space observed by the field gene rating electrode.

Preferably the field extinction electrode device is arranged and connected to the respective circuit in such a manner that by means of said extinction electrode an marginal zone of the field generated by the field generating electrode device is clipped off.

Preferably a separation electrode device is provided between the field gene rating electrode device and the field extinction electrode device. This separation electrode device is preferably located between two insulator material layers and coupled with the shielding electrode device. The separation electrode device can be directly electrically coupled with the shielding electrode device, and may be in particular created integral with said shielding electrode device.

According to various embodiments, the field extinction electrode device may be subjected to electric tension with a phase-offset in respect to the electric tension applied to the field gene rating electrode device. The phase-offset is preferably in the range of n and the voltage is preferably in the range of the voltage at the field gene rating electrode device. It is possible to design the circuit in such a manner that the phase-offset and the tension-difference may be varied in adjustable manner.

The separation electrode device may be shaped that same extends substantially bar-like between the field gene rating electrode device and the field extinction electrode device. Said separation electrode device may be made integral with the shield electrode device.

On the basis of the concept according to various embodiments its made possible to provide capacitive sensors which operate at relative low-frequency and which operate with a distinctive detection orientation. The various embodiments allow to provide capacitive sensors by an appropriate sensor structure and appropriate electronics which perform with a directional detection characteristic.

The field gene rating electrode device forms part of an oscillator, whose frequency-determining capacitance is dependent on the dielectric properties of the area in front of the field gene rating electrode device. If a body approaches to the field gene rating electrode device, the capacitance of said field gene rating electrode device is increased and the frequency is changed. In order to prevent a reduction of the sensitivity under the effect of the ground-electrodes, said ground electrodes are faded out by a signal of same phase position and same level of electric tension, (a transimpedance converter may be used as shield driver).

Figure 1:
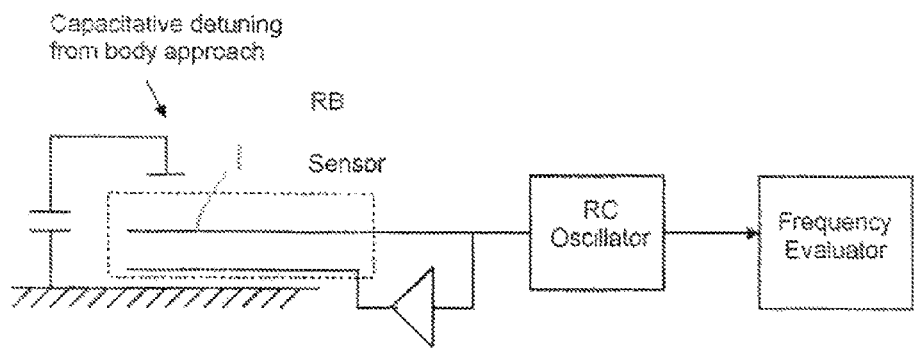
FIG. 1 shows a circuit plan of a sensor system based on the use of electro static interaction effects.

FIG. 1 shows a circuit plan of a sensor system based on the use of field-electrical interaction effects. By means of this sensor system an area in front of the field gene rating electrode 1 may be observed. This is achieved via a field gene rating electrode 1 which forms part of an LC-network. The field gene rating electrode 1 forms part of the frequency-determining capacitance of the LC-network. This capacitance is influenced by the changes of the dielectric properties of the material present in the space RB.

Figure 2:
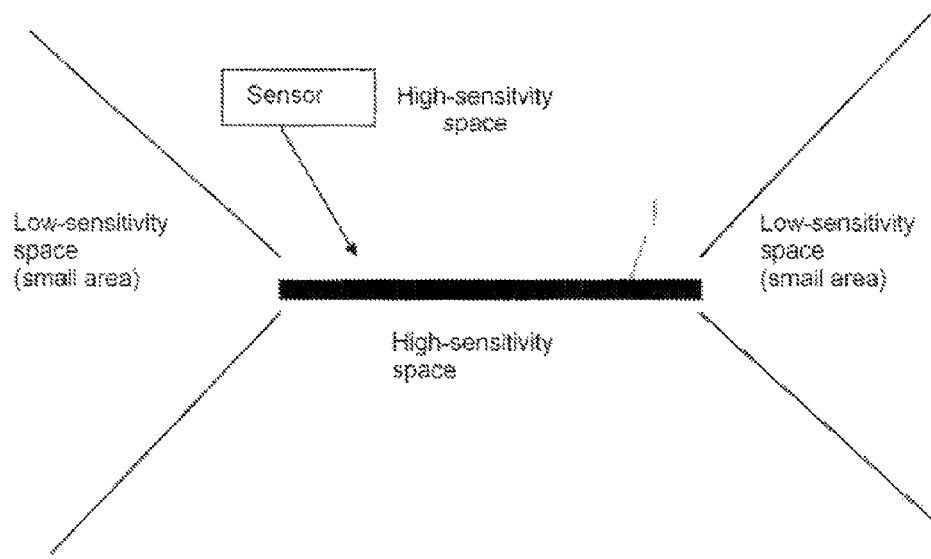
FIG. 2 shows a schematic diagram for illustrating the areas of sensitivity of a flat sensor without shield.

FIG. 2 shows, which zones of the space around the field gene rating electrode device 1 are of influence to the capacitance of the condenser system formed under inclusion of the field gene rating electrode device. As illustrated, those spatial segments neighboring to the main surfaces of the field gene rating electrode 1 are of greater influence to the capacity than the marginal wedge-sections extending between the aforementioned spatial segment above and below the main surfaces.

Figure 3:
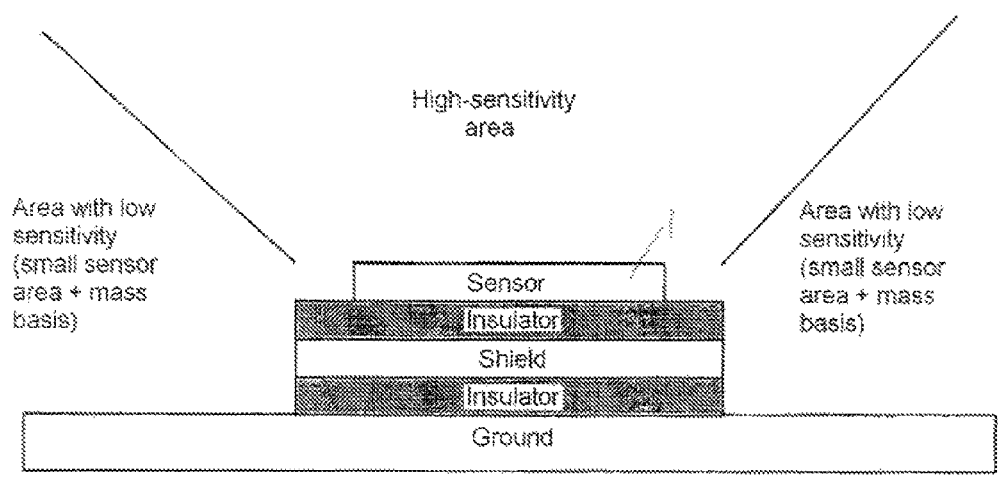
FIG. 3 shows a schematic diagram for illustrating the areas of sensitivity of a flat sensor electrode with shield.

FIG. 3, shows a single-sided shielded arrangement of a field gene rating electrode device. According to the embodiment shown in FIG. 3, the change of the frequency in response to the adherence of a body toward the field gene rating electrode is greater the more said body assumes a position opposite to the surface of the field gene rating electrode.

Figure 4:
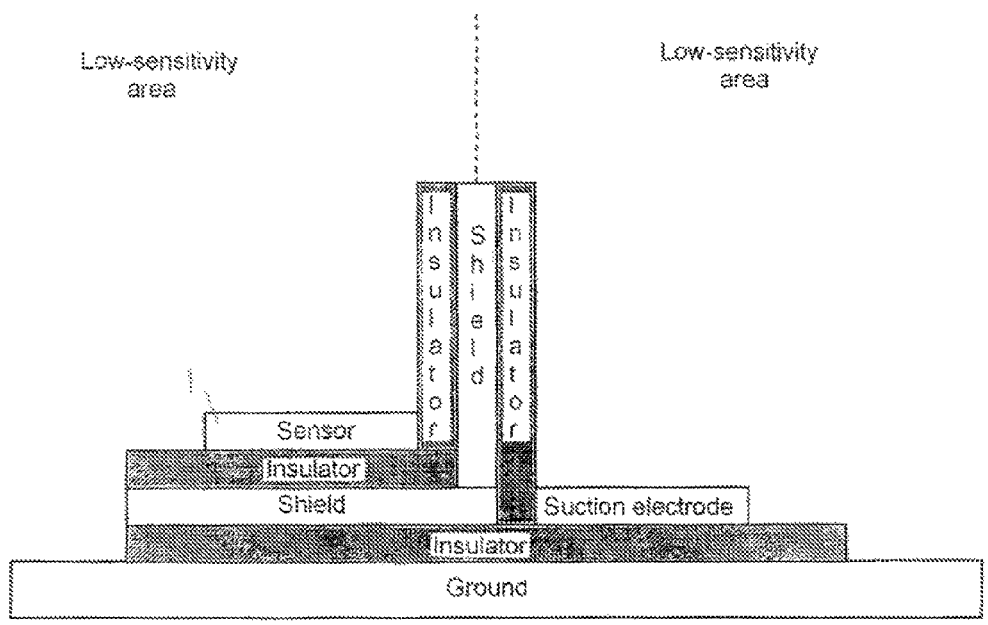
FIG. 4 shows a schematic diagram for illustration of a "putted-field sensor" provided with a field extinction electrode device and a shielding bar electrode.

The particular concept as subsequently described in particular in connection with FIG. 4 allows to obtain at already relative low-frequency ("quasi-static" operated) sensors a remarkably directivity within the near field area. According to various embodiments it is possible to divide the space in front of the sensor and to fade out a defined spatial segment. Thereby a directional characteristic is obtained which is atypical for low-frequency operated capacitive sensors. By this concept according to various embodiments it is possible in an advantageous manner to react (detect, switch, control . . . ) on movements occurring within a relatively exactly limited spatial area and to ignore those movements occurring within a an other spatial segment.

According to various embodiments, electrodes are provided, which provide the effect of neutralizing or suctioning off the sensors field within a desired space. In the following context said electrodes are thus also called as suctioning electrodes. FIG. 4 in so far shows the principle sensor-construction. The electrode arrangement may also be varied. For example the sensor may also be extended in vertical direction to increase its sensitivity in x-direction.

Figure 5:
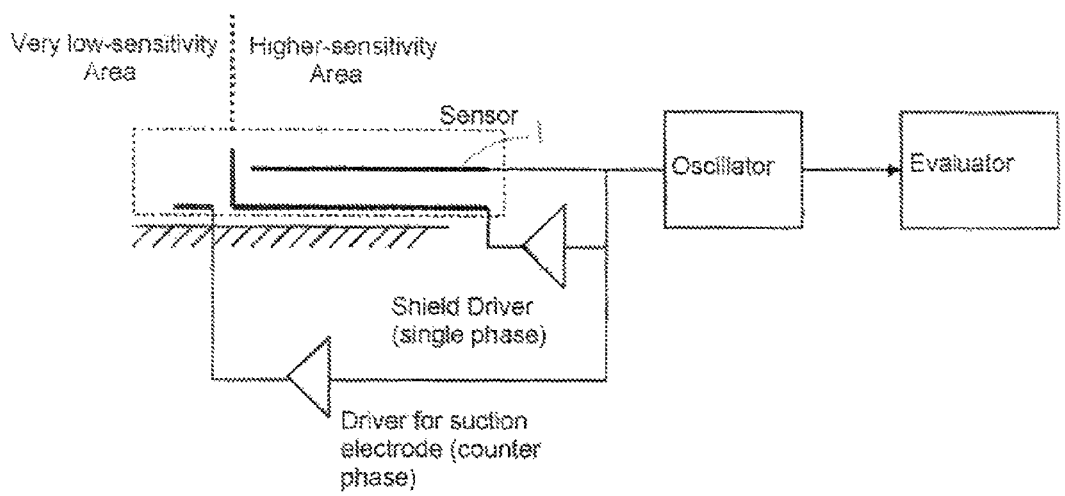
FIG. 5 shows a schematic diagram for illustration of the connection of the electrodes of the sensor according to FIG. 4 for anti-phase tension applied to the field extinction electrode; (cutted-field mode of operation)

FIG. 5 illustrates the principle construction of the electric circuit S according to various embodiments. In order to achieve a good field neutralization in the undesired space segment, the suction electrode is driven in anti-phase to the sensor electrode.

The various embodiments can be used with particular advantage, where a distinct directivity is necessary. This is for example the case by the replacement of light barriers or light-barrier grids or in connection with trapping protection systems were only the endangered region has to be observed. It is suitable also for arranging capacitive switches in line on narrow space.

It is possible, to design the respective sensor circuit to be controllable via an address code. It is also possible, to temporarily vary their operation mode. For example the type of the limitation of the detection field—preferably controlled by an address—may be changed for a certain number or a period of cycles of the detection field. Thereby a combined monitoring of the overall observation area and a recognition of the presence of an object within the overall observation area or within the limited or the overall observation area may be performed. It is further also possible to make use of circuit designs which allow to use selected electrodes alternatingly as field gene rating electrodes and field extinction electrodes.

Figure 6:
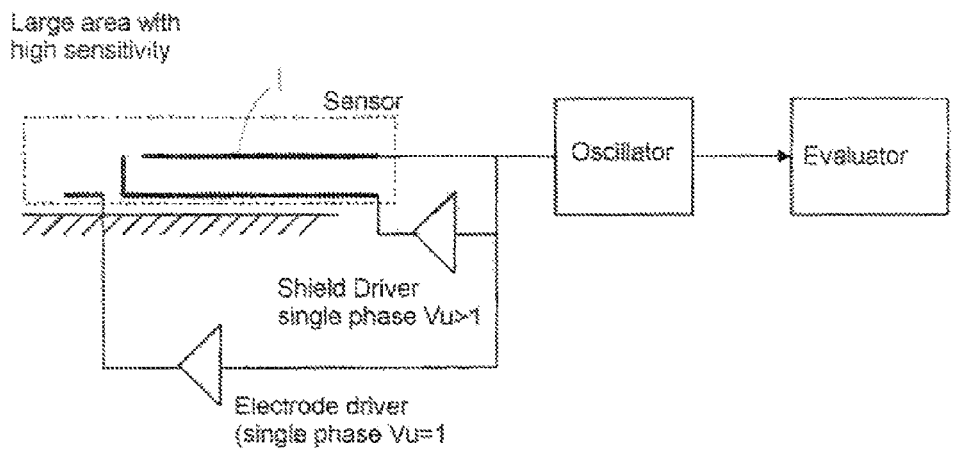
FIG. 6 shows a schematic diagram to the illustration of the connection of the electrodes of the sensor according to FIG. 4 for in-phase tension applied to the field extinction electrode (Wide Field mode of operation).

As evident from FIG. 6 it is possible to reduce the ground capacity for increasing the sensitivity. This is possible by use of the sensor geometry (sensor+shield), if the ground surfaces are compensated beyond the sensor with an shield electrode. On smaller space an increase of the sensitivity may be achieved, by adding a further electrode which is operated, in-phase with a higher voltage than applied to the sensor electrode. The value oft amplification factor of the voltage Vu of the driver must be thus larger than 1. This is possible also in combination with a suctioning electrode. The evaluation of the capacitive change can take place with common evaluation procedures, like e.g. frequency analysis procedures, phase analysis procedures, and amplitude modulation methods.

The invention claimed is:

1. Circuit arrangement comprising:
a field generating electrode device which is incorporated into an LC-network and which comprises an electrode surface area arranged in a first plane and that is exposed toward a field space in such a manner that the capacitance of a condenser system which includes said field generating electrode varies in response of the dielectric properties of material present within said field space,
an insulator layer extending on a rear side opposite said electrode surface area of said field generating electrode device, and facing away from said field space,
a shield electrode device extending on a rear side of said insulating layer and facing away from said field space, wherein the shield electrode device comprises a shield electrode surface area which is arranged in a second plane which is offset from the first plane by means of the insulator layer such that the second plane is not co-planar with the first plane, and
a field extinction electrode device which comprises an electrode surface area arranged within the second plane and facing toward an extinction area, wherein said the field generating electrode device and the field extinction electrode device are arranged in such a manner and subjected to electric voltage that the field space and the extinction space partially overlap each other.

2. Circuit arrangement according to claim 1 wherein the field extinction electrode device is arranged and driven in such a manner that a marginal zone of the field generated by the field generating electrode device and penetrating into the extinction field space is cut.

3. Circuit arrangement according to claim 1 wherein a separation electrode device is provided between the field generating electrode device and the field extinction electrode device.

4. Circuit arrangement according to claim wherein the separation electrode device is arranged between two insulator material layers.

5. Circuit arrangement according to claim 3 wherein the separation electrode device is coupled with the shield electrode device.

6. Circuit arrangement according to claim 4 wherein the separation electrode device is coupled directly with the shield electrode device.

7. Circuit arrangement according to claim 1 wherein a voltage is applied to the field extinction electrode device with a phase-offset and with a higher level with respect to the voltage applied to the field generating electrode device.

8. Circuit arrangement according to claim 7 wherein the phase-offset is substantially $\pi$ and wherein the voltage has substantially the magnitude of the voltage applied to the field generating electrode.

9. Circuit arrangement according to claim 7 wherein the phase-offset is variable in adjustable manner.

10. Circuit arrangement according to claim 7 wherein a voltage difference between the field generating electrode and the field extinction electrode is variable in an adjustable manner.

11. Circuit arrangement according to claim 1 wherein the separation electrode device extends bar-like between the field generating electrode and the field extinction electrode.

12. Circuit arrangement according to claim 1 wherein the separation electrode device extends beyond the first plane into said field space between the field generating electrode and the field extinction electrode.

13. Circuit arrangement according to claim 12 wherein the separation electrode device is arranged between two insulator material layers.

14. Circuit arrangement according to claim 12 wherein the separation electrode device is coupled with the shield electrode device.

15. Circuit arrangement according to claim 12 wherein the separation electrode device is a vertical extension of the shield electrode device.

16. Circuit arrangement comprising:
- a field generating electrode device which is incorporated into an LC-network and which comprises an electrode surface area arranged in a first plane and that is exposed toward a field space in such a manner that the capacitance of a condenser system which includes said field generating electrode varies in response of the dielectric properties of material present within said field space,
- an insulator layer extending on a rear side opposite said electrode surface area of said field generating electrode device, and facing away from said field space,
- a shield electrode device comprising a first portion extending on a rear side of said insulating layer and facing away from said field space and a second portion extending vertically through said first plane into the field space, wherein a shield electrode surface area of the first portion of the shield electrode device is arranged in a second plane which is offset from the first plane by means of the insulator layer such that the second plane is not co-planar with the first plane, and
- a field extinction electrode device which comprises an electrode area arranged within the second plane and facing toward an extinction area, wherein said field generating electrode device and the field extinction electrode device are arranged in such a manner and subjected to electric voltage that the field space and the extinction space partially overlap each other.

17. Circuit arrangement according to claim 16 wherein the field extinction electrode device is arranged and driven in such a manner that a marginal zone of the field generated by the field generating electrode device and penetrating into the extinction field space is cut.

18. Circuit arrangement according to claim 16 wherein the second portion of the shield electrode device is arranged between two insulator material layers.

19. Circuit arrangement according to claim 16 wherein a voltage is applied to the field extinction electrode device with a phase-offset and with a higher level with respect to the voltage applied to the field generating electrode device.

20. Circuit arrangement according to claim 19 wherein the phase-offset is substantially $\pi$ and wherein the voltage has substantially the magnitude of the voltage applied to the field generating electrode.

* * * * *

UNITED STATES PATENT AND TRADEMARK OFFICE
CERTIFICATE OF CORRECTION

| | | |
|---|---|---|
| PATENT NO. | : 8,339,147 B2 | Page 1 of 1 |
| APPLICATION NO. | : 12/282894 | |
| DATED | : December 25, 2012 | |
| INVENTOR(S) | : Klaus Kaltner | |

It is certified that error appears in the above-identified patent and that said Letters Patent is hereby corrected as shown below:

Column 4, line 45,
Claims, Claim 4, "Circuit arrangement according to claim wherein the separation electrode device is arranged between two insulator material layers" should read
-- CIRCUIT ARRANGEMENT ACCORDING TO CLAIM 3 WHEREIN THE SEPARATION ELECTRODE DEVICE IS ARRANGED BETWEEN TWO INSULATOR MATERIAL LAYERS --.

Column 4, line 48,
Claims, Claim 5, "Circuit arrangement according to claim 3 wherein the separation electrode device is coupled with the shield electrode device" should read
-- CIRCUIT ARRANGEMENT ACCORDING TO CLAIM 4 WHEREIN THE SEPARATION ELECTRODE DEVICE IS COUPLED WITH THE SHIELD ELECTRODE DEVICE --.

Signed and Sealed this
Twelfth Day of March, 2013

Teresa Stanek Rea
*Acting Director of the United States Patent and Trademark Office*